(12) United States Patent  (10) Patent No.: US 8,182,981 B2
Nakamura  (45) Date of Patent: May 22, 2012

(54) PATTERN FORMING METHOD

(75) Inventor: Hiroko Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 366 days.

(21) Appl. No.: 12/497,734

(22) Filed: Jul. 6, 2009

(65) Prior Publication Data
US 2010/0021850 A1 Jan. 28, 2010

(30) Foreign Application Priority Data

Jul. 23, 2008 (JP) ................................. 2008-189966

(51) Int. Cl.
G03F 7/26 (2006.01)

(52) U.S. Cl. ........................................ 430/313; 430/394

(58) Field of Classification Search .................. 430/312, 430/330, 323, 314, 315, 313
See application file for complete search history.

(56) References Cited

U.S. PATENT DOCUMENTS

| 6,015,650 | A | 1/2000 | Bae |
| 2007/0269746 | A1 | 11/2007 | Nakamura |
| 2008/0248427 | A1* | 10/2008 | Thiyagarajan et al. .... 430/287.1 |
| 2010/0068656 | A1* | 3/2010 | Yeh et al. ...................... 430/323 |

FOREIGN PATENT DOCUMENTS

| JP | 2757983 | 3/1998 |
| JP | 2009-272623 | 11/2009 |

OTHER PUBLICATIONS

D.C. Owe-Yang et al., "Double Exposure for the Contact Layer of the 65-nm Node," Advances in Resist Technology and Processing XXII, edited by John L. Sturtevant, Proceedings of SPIE vol. 5753, pp. 171-180 (SPIE, Bellingham, WA, 2005).
A. Vanleenhove et al., "A Litho-only Approach to Double Patterning," Optical Microlithography XX, edited by Donis G. Flagello, Proc. of SPIE vol. 6520, pp. 65202F1-65202F10 (2007).
H. Nakamura et al., "Ion Implantation as Insoluble Treatment for Resist Stacking Process," Advances in Resist Materials and Processing Technology XXV, edited by Clifford L. Henderson, Proc. of SPIE vol. 6923, pp. 692322-1-692322-12, (2008).
Notification of Reasons for Rejection issued by the Japanese Patent Office on Feb. 28, 2012, for Japanese Patent Application No. 2008-189966, and English-language translation thereof.

* cited by examiner

Primary Examiner — Kathleen Duda
Assistant Examiner — Caleen Sullivan
(74) Attorney, Agent, or Firm — Finnegan, Henderson, Farabow, Garrett & Dunner, L.L.P.

(57) ABSTRACT

A pattern forming method has forming a first resist film on a processed film, patterning the first resist film into a first resist pattern, forming a first film containing a photo acid generator so as to cover the first resist pattern, forming a second resist film so as to cover the first film, irradiating a predetermined region of the second resist film with exposure light, heating the first film and the second resist film, performing a development process, removing the second resist film of the predetermined region and forming a second resist pattern while the first film is left, and etching the processed film with the first resist pattern and the second resist pattern as a mask.

19 Claims, 8 Drawing Sheets

PATTERN FORMING METHOD

CROSS REFERENCE TO RELATED APPLICATION

This application is based upon and claims benefit of priority from the Japanese Patent Application No. 2008-189966, filed on Jul. 23, 2008, the entire contents of which are incorporated herein by reference.

BACKGROUND OF THE INVENTION

The present invention relates to a pattern forming method.

In manufacturing a semiconductor device, a photolithographic technique is adopted to form a circuit pattern on a wafer. In a procedure for forming the circuit pattern using the photolithographic technique, a resist solution is applied onto the wafer to form a resist film, the resist film is irradiated with light to expose the resist film according to the desired circuit pattern, and a development process is performed to the resist film.

Recently, with a finer design rule of the semiconductor device, double patterning (multiple patterning) is proposed as the photolithographic technique for realizing high resolution. A hard mask process is well known as one of the double patterning techniques. In the hard mask process, a design pattern is divided into plural portions, and the resist patterning and transfer to the hard mask are performed to each divided design pattern. Finally a processed film is processed with the hard mask as an etching mask. However, cost increase becomes troublesome in the hard mask process.

A pattern forming method is proposed as a technique of performing the double patterning at low cost (for example, see Japanese patent No. 2757983). In the pattern forming method disclosed in Japanese patent No. 2757983, resist patterns are stacked, and the processed film is processed with the stacked multilayer resist patterns as the etching mask. In the pattern forming method, an insolubilized film is formed on a surface of a lower-layer resist pattern so as to prevent the lower-layer resist pattern from being dissolved in patterning an upper-layer resist.

However, in the pattern forming method disclosed in Japanese patent No. 2757983, a resist residue is likely to be generated in a sidewall portion of the lower-layer resist pattern in the region constituting a space when the patterning (development process) of the upper-layer resist is performed, unfortunately critical dimensions (CDs) of the lower-layer resist pattern are changed from desired values and accuracy became low.

SUMMARY OF THE INVENTION

According to one aspect of the present invention, there is provided a pattern forming method comprising:
forming a first resist film on a processed film;
patterning the first resist film into a first resist pattern;
forming a first film containing a photo acid generator so as to cover the first resist pattern;
forming a second resist film so as to cover the first film;
irradiating a predetermined region of the second resist film with exposure light;
heating the first film and the second resist film;
performing a development process, removing the second resist film of the predetermined region and forming a second resist pattern while the first film is left; and
etching the processed film with the first resist pattern and the second resist pattern as a mask.

According to one aspect of the present invention, there is provided a pattern forming method comprising:
forming a first resist film on a processed film;
patterning the first resist film into a first resist pattern;
forming a first film so as to cover the first resist pattern;
forming a photo acid generator containing film containing a photo acid generator on the first film;
forming a second resist film so as to cover the photo acid generator containing film;
irradiating a predetermined region of the second resist film with exposure light;
heating the first film and the second resist film;
performing a development process, removing the second resist film of the predetermined region and forming a second resist pattern while the first film is left; and
etching the processed film with the first resist pattern and the second resist pattern as a mask.

According to one aspect of the present invention, there is provided a pattern forming method comprising:
forming a first resist film on a processed film;
patterning the first resist film into a first resist pattern;
forming a first film containing a thermal acid generator so as to cover the first resist pattern;
forming a second resist film so as to cover the first film;
irradiating a predetermined region of the second resist film with exposure light;
heating the first film and the second resist film;
performing a development process, removing the second resist film of the predetermined region and forming a second resist pattern while the first film is left; and
etching the processed film with the first resist pattern and the second resist pattern as a mask.

DESCRIPTION OF THE EMBODIMENTS

A pattern forming method according to an exemplary embodiment of the invention will be described with reference to the drawings.

Figure 1:
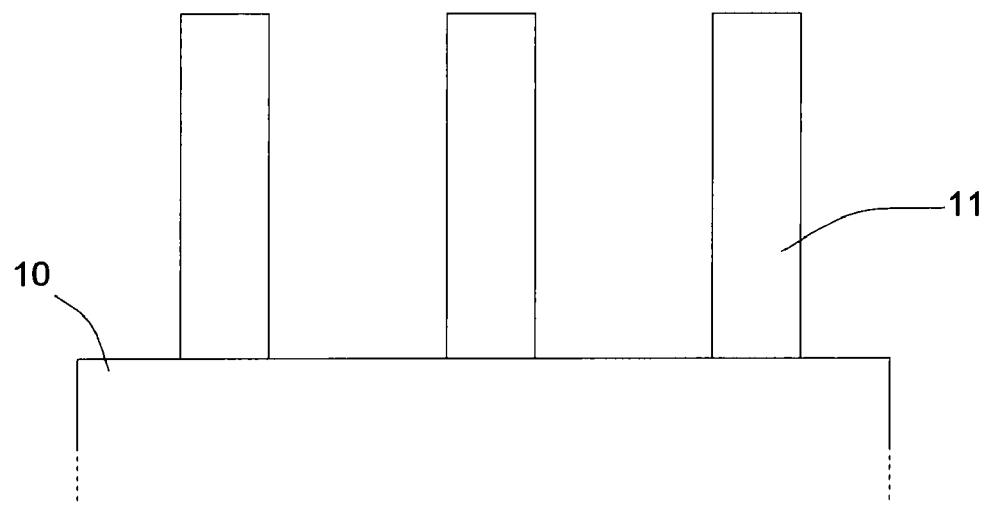
FIG. 1 is a process sectional view explaining a pattern forming method according to an embodiment of the invention.

As illustrated in FIG. 1, a processed film (not illustrated) and an antireflective coating 10 are sequentially formed on a wafer (not illustrated). A resist film is applied onto the antireflective coating 10, and patterning is performed to form a first-layer resist pattern 11.

Figure 2:
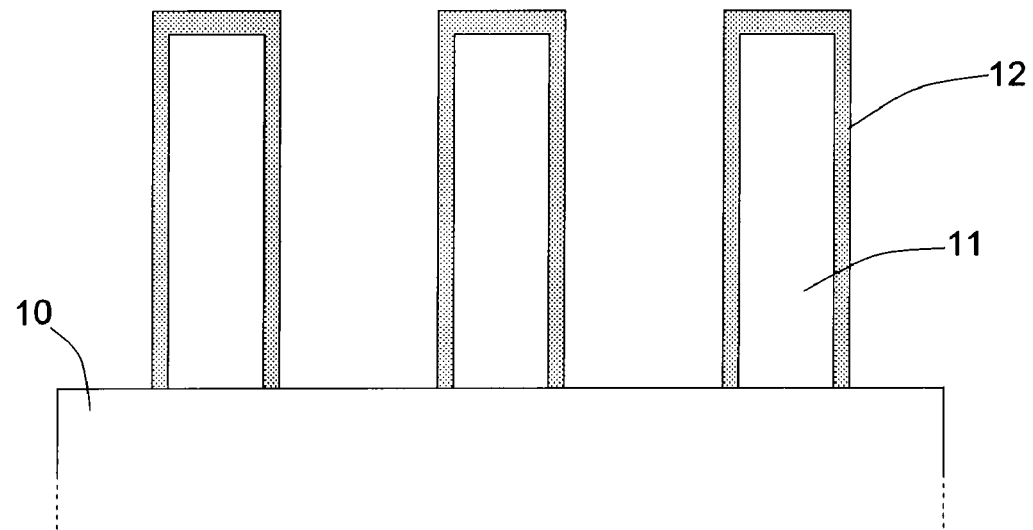
FIG. 2 is a process sectional view subsequent to FIG. 1.

As illustrated in FIG. 2, an insolubilized film (first film) 12 containing a photo acid generator (hereinafter abbreviated to PAG) is formed in a surface of the first-layer resist pattern 11. The insolubilized film 12 protects the first-layer resist pattern 11 such that the first-layer resist pattern 11 is not dissolved in forming a second-layer resist pattern (in resist application and in development) in a subsequent process.

An example of a method for forming the insolubilized film 12 containing PAG will be described. PAG is dissolved in an insolubilized film solution in which a resin crosslinking under the presence of acid is dissolved. The insolubilized film solution is applied, bake is performed at about 130° C., and development is performed to form the insolubilized film 12 containing PAG.

The insolubilized film 12 containing PAG is formed only in an upper surface and a side surface of the first-layer resist pattern 11, because the crosslink is formed by utilizing the acid remaining in the surface (the upper surface and the side surface) of the first-layer resist pattern 11.

Figure 3:
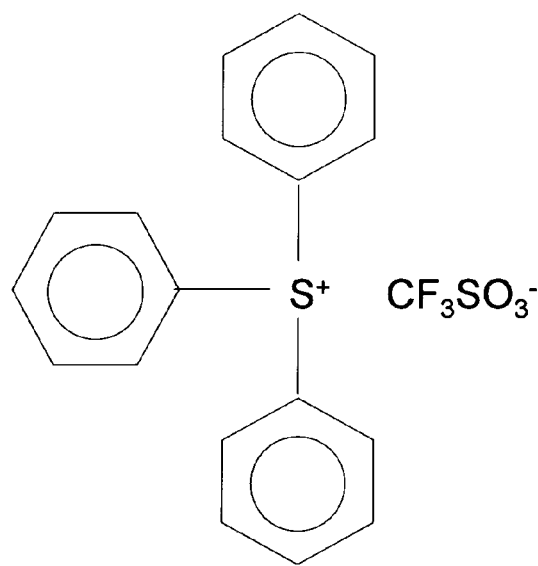
FIG. 3 is a view illustrating a structural formula of triphenyl sulfonium triflate.

For example, phenol resin and alkoxy melanin that is crosslinker can be used as the resin for forming the insolubilized film. Onium salts such as triphenyl sulfonium triflate illustrated in FIG. 3 can be used as PAG, and PAG is not decomposed at 130° C. that is of the bake temperature of the insolubilized film.

Figure 4:
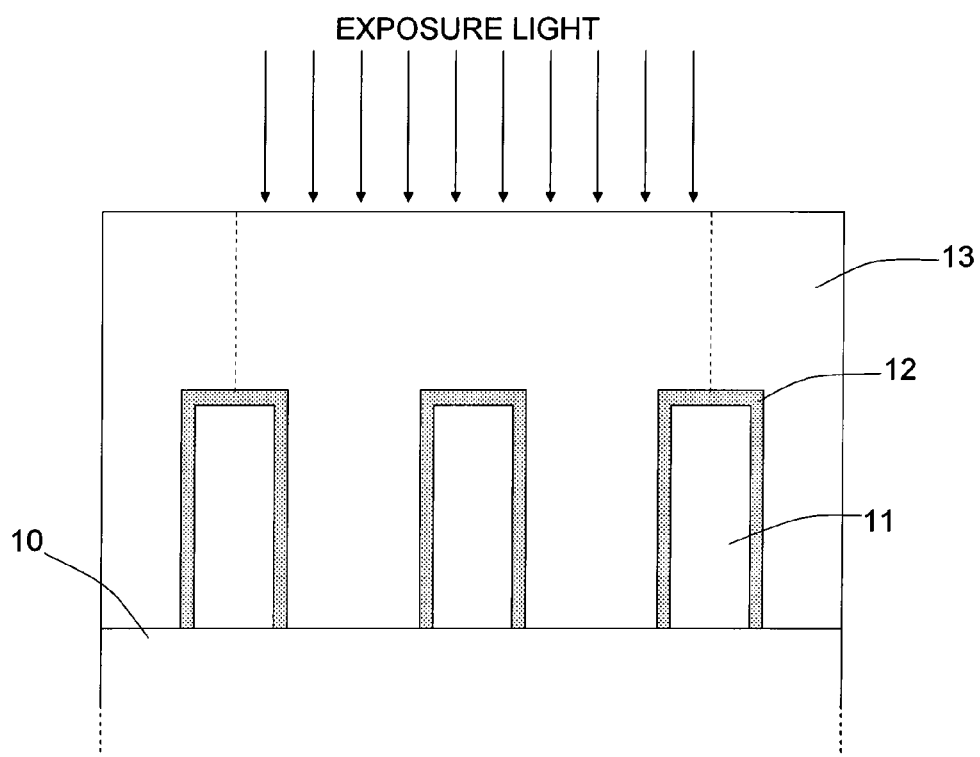
FIG. 4 is a process sectional view subsequent to FIG. 2.

As illustrated in FIG. 4, a resist film 13 is applied, and a desired region (region where a space is formed) is irradiated with exposure light. The acid is generated from PAGs of the resist film 13 and the insolubilized film 12 in the region irradiated with the exposure light. Because the acid is also generated in the insolubilized film 12, a concentration gradient of the acid becomes extremely small between the insolubilized film 12 and the resist film 13.

Then post exposure bake (PEB) is performed to generate a deprotection reaction, and exposure light irradiation region dissolves in a developer. The deprotection reaction is sufficiently generated because the concentration gradient of the acid is extremely small between the insolubilized film 12 and the resist film 13.

Figure 5:
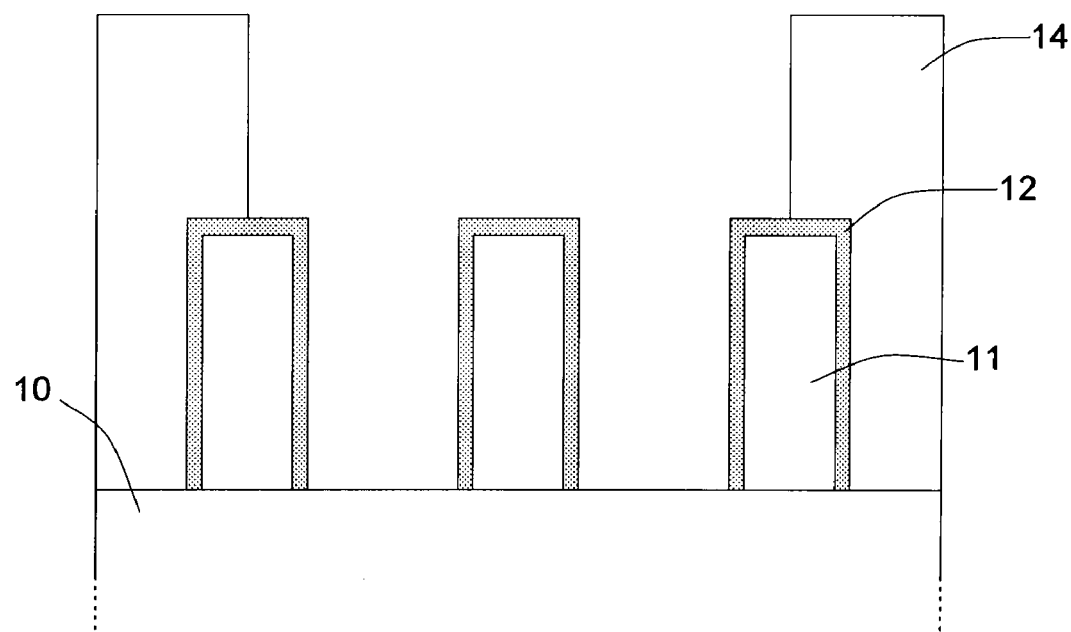
FIG. 5 is a process sectional view subsequent to FIG. 4.

As illustrated in FIG. 5, a development process is performed using a developer corresponding to the resist film 13, and the exposure light irradiation region of the resist film 13 is removed to form a desired second-layer resist pattern 14. Because the deprotection reaction is sufficiently generated in the process illustrated in FIG. 4, the generation of the residue of the resist film 13 is restrained after the development, and the CD change of the first-layer resist pattern 11 is restrained.

Then the antireflective coating 10 and the processed film are patterned with the second-layer resist pattern 14 and the first-layer resist pattern 11 as the mask. Because the generation of the residue of the resist film 13 is restrained after the development, the processed film pattern is obtained with high dimensional accuracy.

Comparative Example

Figure 6:
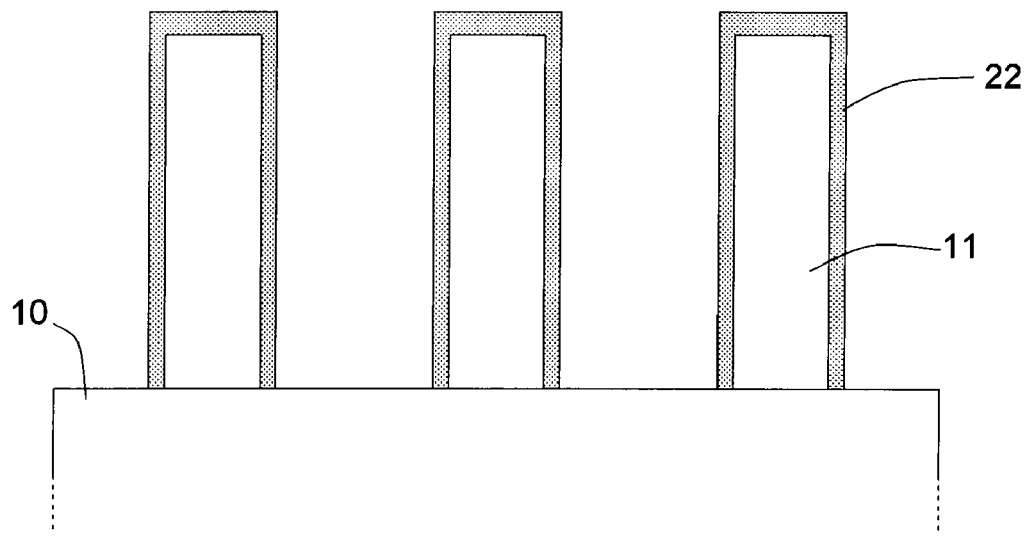
FIG. 6 is a process sectional view explaining a pattern forming method according to a comparative example.

A pattern forming method according to a comparative example will be described with reference to FIGS. 6 to 8. First, as with the embodiment, the first-layer resist pattern 11 is formed (see FIG. 1). Then, as illustrated in FIG. 6, an insolubilized film 22 is formed on the first-layer resist pattern 11. Although the insolubilized film 12 contains PAG in the embodiment, the insolubilized film 22 does not contain PAG.

Figure 7:
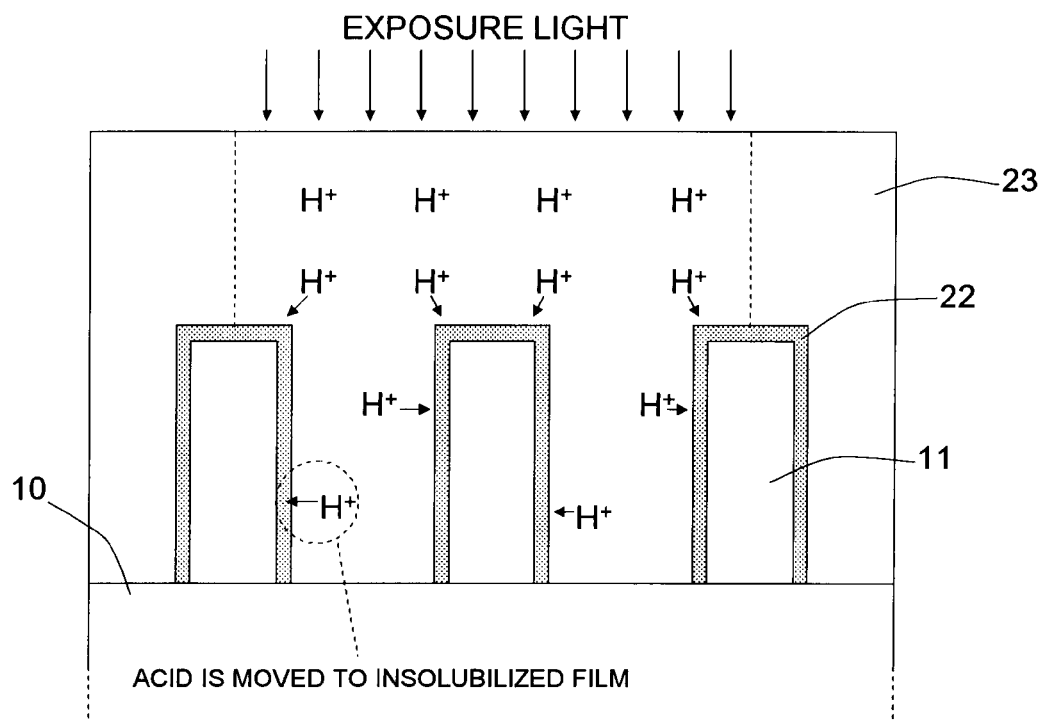
FIG. 7 is a process sectional view subsequent to FIG. 6.

As illustrated in FIG. 7, a resist film 23 is applied onto the insolubilized film 22, and the desired region (region where a space is formed) is irradiated with the exposure light. The acid is generated in the resist film 23 of the region irradiated with the exposure light. At this point, because the acid is not generated in the insolubilized film 22, the acid generated in the resist film 23 is moved to the insolubilized film 22, and the large concentration gradient of the acid is generated.

PEB is performed to generate the deprotection reaction, and the exposure light irradiation region is solubilized in the developer. Because the large concentration gradient of the acid is generated between the insolubilized film 22 and the resist film 23, the deprotection reaction is insufficiently generated in a sidewall portion of the first-layer resist pattern 11.

Figure 8:
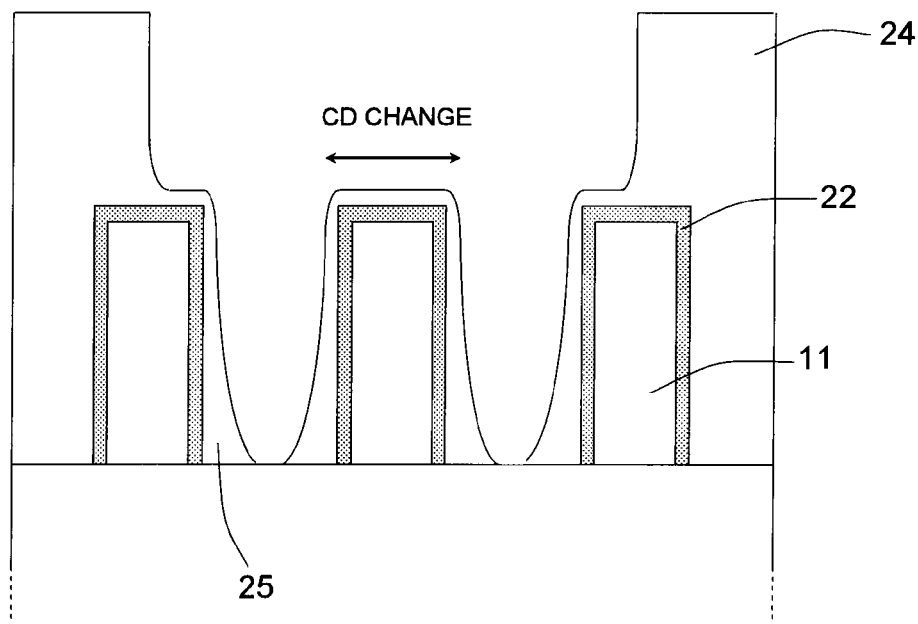
FIG. 8 is a process sectional view subsequent to FIG. 7.

As illustrated in FIG. 8, the development process is performed using a developer corresponding to the resist film 23, and the exposure light irradiation region of the resist film 23 is removed to form a second-layer resist pattern 24. A residue 25 is generated because the deprotection reaction is insufficiently generated in the process illustrated in FIG. 7.

The presence of the residue 25 changes the CDs of the first-layer resist pattern 11. The desired pattern is not obtained when the processed film is patterned with the first-layer resist pattern 11 and second-layer resist pattern 24 as the mask because of the residues 25 formed in sidewall portions of the first-layer resist pattern 11.

On the other hand, in the embodiment, because the insolubilized film 12 contains PAG, the acid is generated in the insolubilized film 12 during the exposure process, and the concentration gradient of the acid can extremely be decreased between the insolubilized film 12 and the resist film 13. Therefore, the deprotection reaction of the resist film 13 is sufficiently generated, and the generation of the residue is restrained after the development process. In the region that is not irradiated with the exposure light, because the acid is not generated from the insolubilized film 12, resist film 13 is not affected.

Thus, the resist pattern having high dimensional accuracy is obtained by the exposure process of the embodiment, so that the processing accuracy of the processed film can be improved with the resist pattern as the mask.

In the embodiment, PAG is dissolved in the insolubilized film solution in which the resin for forming the insolubilized film 12 is dissolved. Alternatively, PAG may be bonded to an insolubilized film resin. The insolubilized film solution is also applied to the first-layer resist pattern and heated, whereby the insolubilized film resin has a function of protecting the first-layer resist pattern 11 such that the first-layer resist pattern 11 is not dissolved in forming the second-layer resist pattern (in resist application and in development).

Preferably the insolubilized film resin is bonded to an anion of PAG. When the insolubilized film resin is bonded to an anion of PAG, diffusion of the acid is restrained. This is because, even if the amount of acid in the insolubilized film 12 is more than that in the resist film 13, the diffusion of the acid to the resist film 13 can be restrained, which prevents the shape of the second-layer resist pattern 14 from being affected.

Figure 9:
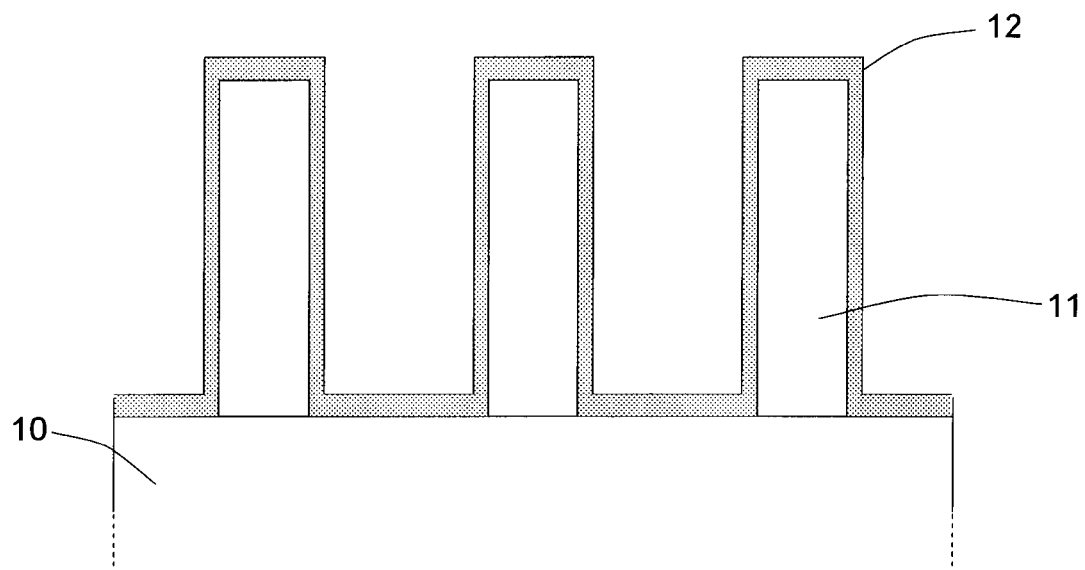
FIG. 9 is a process sectional view explaining a pattern forming method according to a variation.

As illustrated in FIG. 9, the insolubilized film 12 containing PAG may be formed in not only the surface of the first-layer resist pattern 11 but also the upper surface of the antireflective coating 10, that is, in the whole surface. In the second resist film constituting the second-layer resist pattern after development, the acid sometimes moves to not only the insolubilized film 12 but also the lower-layer antireflective coating 10, and the concentration gradient of the acid may be generated. Therefore, the concentration gradient of the acid can further be restrained by forming the insolubilized film 12 containing PAG in the whole surface, and the generated residue can further be reduced.

An etching enhancement material (EEP), disclosed in D. C. Owe-Yang et al. Proc. SPIE 5753 (2005) pp. 171-179, is an example of forming insolubilized film in the whole surface. The method for forming the insolubilized film 12 containing PAG in the whole surface can be applied to EEP by dissolving PAG into EEP solution.

In cases where the insolubilized film 12 containing PAG is formed in the whole surface, the insolubilized film 12 in the space portion is removed by the etching before the antireflective coating 10 is etched.

Alternatively, the insolubilized film 12 containing PAG may be formed in the whole surface by simultaneously depositing the insolubilized film and PAG using a CVD method or a sputtering method.

Figure 10:
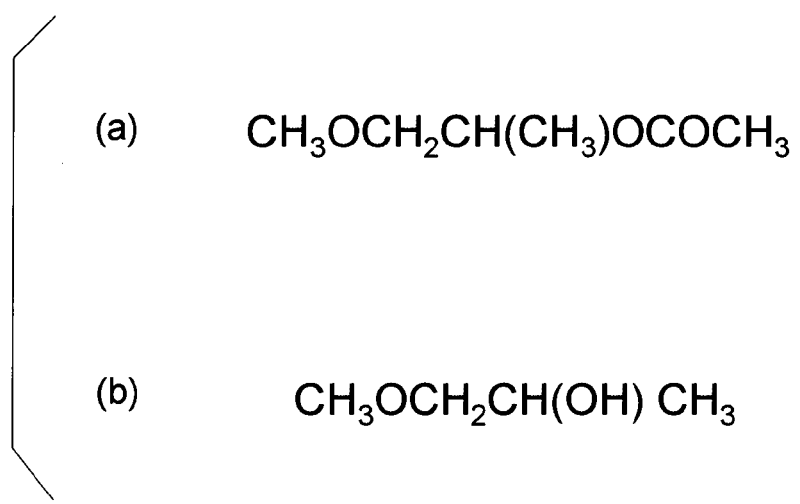
FIG. 10 is a view illustrating a composition formula of an organic solvent.

Alternatively, after the insolubilized film is formed in the whole surface by the CVD method or a sputtering method, an organic solvent in which PAG is dissolved is applied to the surface of the insolubilized film, and the organic solvent may be dried to disperse PAG in the surface of the insolubilized film. General resist solvents such as propylene glycol monomethyl ether acetate (PEGMEA) illustrated in FIG. 10(a) and propylene glycol monomethyl ether (PEGME) illustrated in FIG. 10(b) can be used as the organic solvent.

Figure 11:
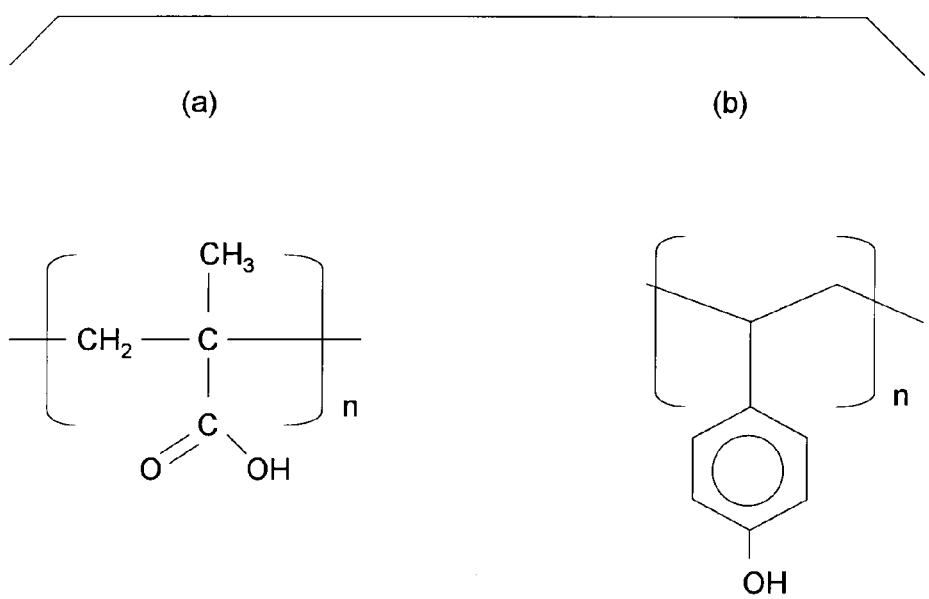
FIG. 11 is a view illustrating a structural formula of a base resin of a resist.

Alternatively, a solution in which a resin and PAG are dissolved is applied to the surface of the insolubilized film, and the bake may be performed. The resin is formed on the insolubilized film, so that PAG can sufficiently be fixed to the surface of the insolubilized film. Examples of the resin include polymethyl methacrylate illustrated in FIG. 11(a) that is of a basic resin of an ArF resist and polyhydroxy styrene illustrated in FIG. 11(b) that is of a basic resin of a KrF resist.

Alternatively, a solution in which a resin bonded to PAG is dissolved is applied to the surface of the insolubilized film, and the bake may be performed. The diffusion of the acid generated in the insolubilized film can be restrained, which prevents the shape of the second-layer resist pattern from being affected.

Figure 12:
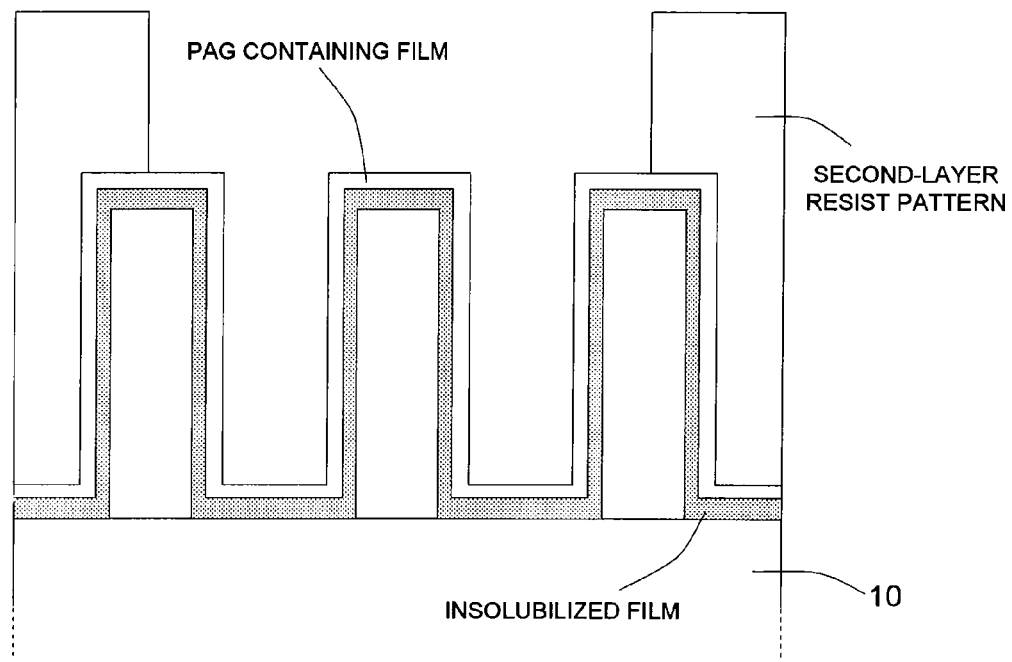
FIG. 12 is a process sectional view explaining a pattern forming method according to a variation.

In cases where the PAG containing film is formed after the insolubilized film is formed in the whole surface, as illustrated in FIG. 12, the insolubilized film and the PAG containing film are formed in the space portion after the patterning of the second-layer resist pattern. Accordingly, a process for etching the PAG containing film and insolubilized film in the space portion is required before the etching of the antireflective coating 10.

Figure 13:
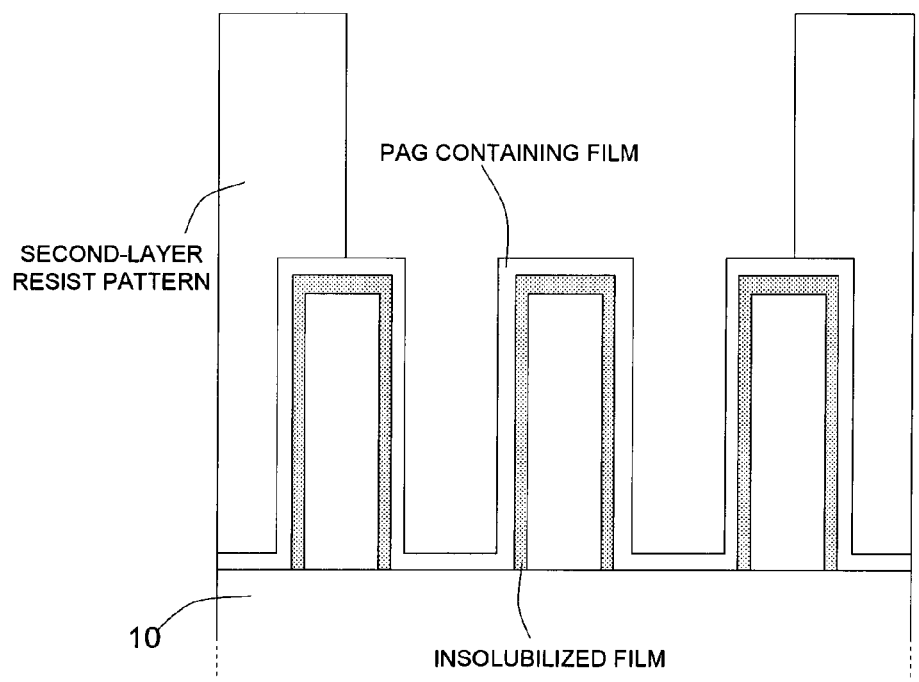
FIG. 13 is a process sectional view explaining a pattern forming method according to a variation.

Alternatively, the insolubilized film that does not contain PAG is formed only in the surface of the first-layer resist pattern, and the PAG containing film may be formed in the whole surface. In such cases, as illustrated in FIG. 13, because the PAG containing film exists in the space portion after the patterning of the second-layer resist pattern, a process for etching the PAG containing film is required before the etching of the antireflection film 10.

Figure 14:
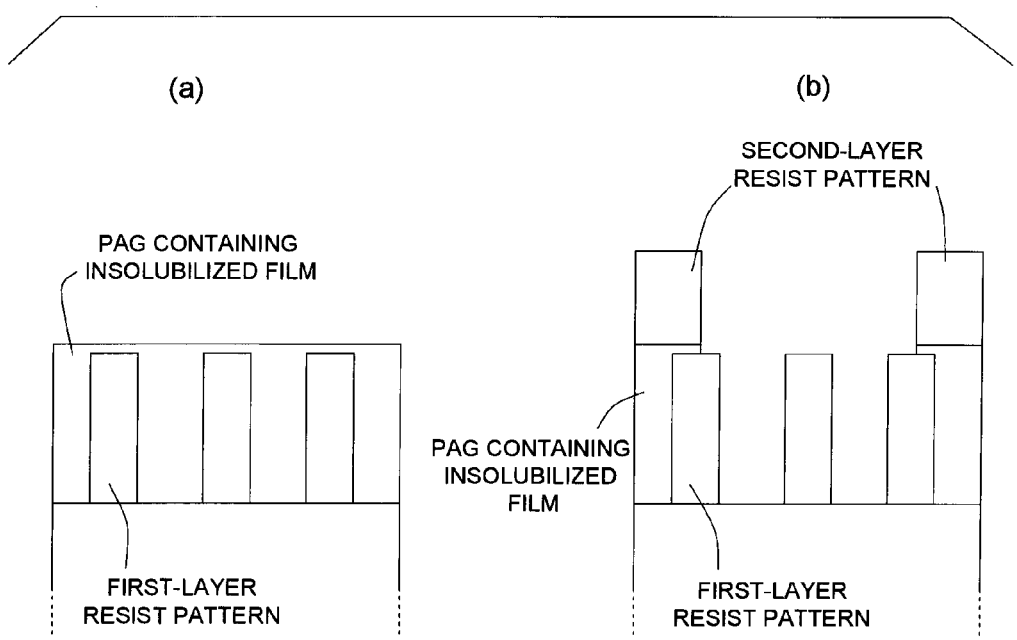
FIG. 14 is a process sectional view explaining a pattern forming method according to a variation.

As illustrated in FIG. 14(a), the deposition of the insolubilized film containing PAG and a planarization process may be performed after the patterning of the first-layer resist pattern. In such cases, it is necessary that the insolubilized film have a large etching selectivity to the resist. As illustrated in FIG. 14(b), the insolubilized film in the space portion is selectively etched and removed after the patterning of the second-layer resist pattern.

Figure 15:
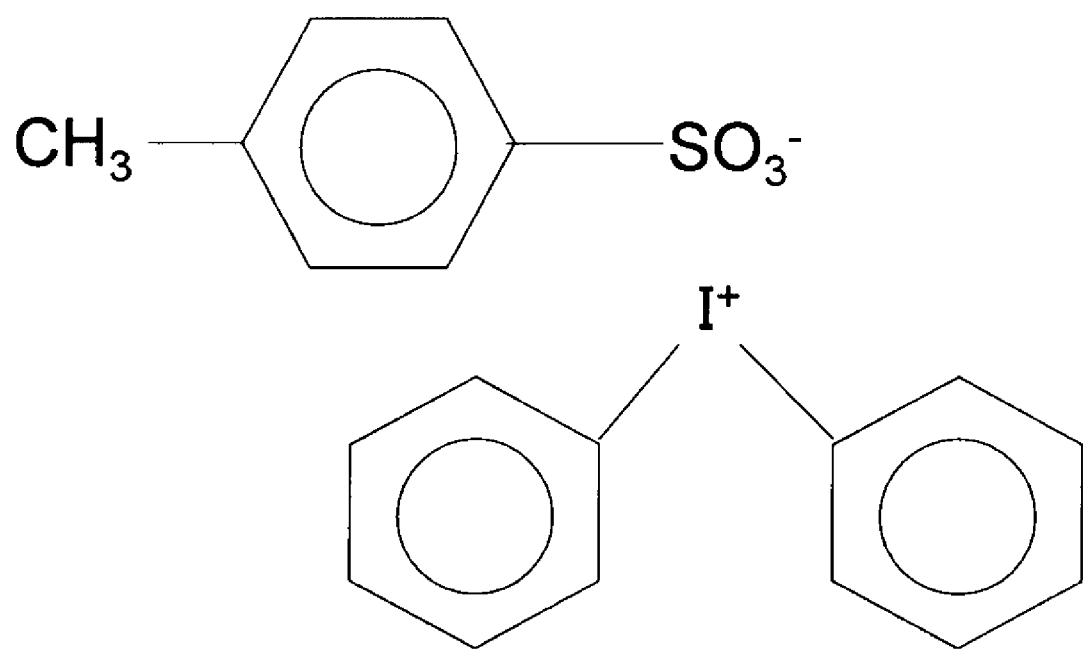
FIG. 15 is a view illustrating a structural formula of diphenyl iodonium methylphenyl sulfonate.

In the embodiment, PAG is used to generate the acid in the insolubilized film 12 or in the surface of the insolubilized film 12. Alternatively, thermal acid generator (TAG) may be used. For example, diphenyl iodonium methylphenyl sulfonate illustrated in FIG. 15 can be used as TAG.

In cases where the insolubilized film is an oxide film formed by the CVD method, an acidified OH group is formed on the surface of the insolubilized film by applying water depending on a kind (for example, $TiO_2$) of the oxide film. Therefore, in processing the second-layer resist pattern, the generation of the concentration gradient of the acid can be restrained without forming the film containing PAG or TAG. Alternatively an acid solution such as acetic acid may be applied to the insolubilized film to hold the acid.

Alternatively, the lower-layer resist pattern is cured with an electron beam, an ion, UV light, or DUV light to form the insolubilized film in the surface, and the PAG containing film may be formed on the insolubilized film.

Preferably the pattern forming method of the embodiment is adopted in cases where a pattern that cannot be formed by single exposure is formed with double resist patterns, in cases where the resist pattern is used instead of the hard mask, or in cases where patterns having different depths are formed once.

In cases where the pattern that cannot be formed by single exposure is formed with the double resist patterns, for example, an Line and Space (L&S) pattern of 1:3 is formed with a first-layer resist pattern, and the L&S pattern of 1:3 shifted by a half period from the first-layer resist pattern is formed with a second-layer resist pattern, thereby forming the L&S pattern having a half period of the L&S pattern of 1:3.

For example, after a dense contact hole pattern is formed, only a desired contact hole pattern is opened by the second-layer resist pattern. The dense contact hole pattern can be formed because an illumination condition dedicated to the dense contact hole pattern can be used. An isolated contact hole pattern that cannot be formed once is formed by the method.

For example, the L&S patterns orthogonal to each other are formed twice, and a common space portion of the L&S patterns constitutes the contact hole. The L&S pattern has higher resolution than the contact hole pattern, and the L&S pattern has a wider process window. Therefore, the contact hole pattern that cannot be formed by the single exposure is formed by utilizing the features of the L&S pattern.

For example, the pattern formation performed by double exposure in which the single-layer resist is exposed twice can be performed by forming the double-layer resist patterns.

A three-dimensional pattern that cannot be formed by the single exposure is performed by forming the double-layer resist patterns. Although a T-shape interconnection layer cannot be formed by the single exposure, the T-shape interconnection layer can be formed by stacking the resist patterns.

In cases where the resist pattern is used instead of the hard mask, for example, the two resist patterns are stacked without transferring the first-layer resist pattern to the hard mask. The processed film is etched with the stacked resist patterns as the etching mask.

Formation of a damascene pattern can be cited as an example of the formation of the pattern having the different depths at once. In a well-known damascene pattern forming method for making the contact hole below a groove, a groove resist pattern (first-layer resist pattern) is formed on an oxide film. The groove resist pattern is the etching mask to form the groove of the oxide film. Then, the contact hole pattern is formed with the second-layer resist pattern on the oxide groove pattern. And the oxide film is etched to make the contact hole. In another well-known damascene pattern, the contact hole pattern is formed with the first-layer resist pattern, the contact hole pattern is transferred to the hard mask, the second-layer resist pattern is formed, and the damascene pattern is formed with the second-layer resist pattern and the hard mask as the etching masks. However, the number of processes is increased in the well-known methods.

A contact hole resist pattern (first-layer resist pattern) and a groove resist pattern (second-layer resist pattern) are sequentially stacked on an oxide film. The oxide film are etched with the second-layer resist pattern and the first-layer resist pattern, and the groove and the contact hole below the groove are formed simultaneously. Therefore, the number of processes can be decreased. The CD accuracy can be improved by applying the embodiment to the formation of the damascene pattern.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
    forming a first resist film on a processed film;
    patterning the first resist film into a first resist pattern;
    forming a first film containing a photo acid generator so as to cover the first resist pattern, the first film being an alcohol-based film;
    forming a second resist film so as to cover the first film;
    irradiating a predetermined region of the second resist film with exposure light;
    heating the first film and the second resist film;
    performing a development process, removing the second resist film of the predetermined region and forming a second resist pattern while the first film is left; and
    etching the processed film with the first resist pattern and the second resist pattern as a mask.

2. The pattern forming method according to claim 1, comprising:
    applying a solution so as to cover the first resist pattern, the solution containing a resin and the photo acid generator, the resin crosslinking in the presence of acid;
    heating the solution to crosslink the resin in an upper surface and a side surface of the first resist pattern;
    performing a development process to remove uncrosslinking resin; and
    forming the first film only in the upper surface and side surface of the first resist pattern.

3. The pattern forming method according to claim 1, comprising:
    applying a solution so as to cover the first resist pattern, the solution containing the photo acid generator and a resin for forming the first film, the photo acid generator being bonded to the resin; and
    heating the solution to form the first film.

4. The pattern forming method according to claim 3, wherein the photo acid generator is an onium salt, and an anion of the onium salt is bonded to the resin.

5. The pattern forming method according to claim 1, wherein the first film is also formed in a surface of the processed film between the first resist patterns.

6. The pattern forming method according to claim 5, wherein the photo acid generator and the first film are deposited by a CVD method or a sputtering method so as to cover the first resist pattern and the processed film.

7. The pattern forming method according to claim 5, wherein a gap between the first resist patterns is buried to form the first film such that an upper surface of the first film is higher than the upper surface of the first resist pattern, and
    after the second resist pattern is formed, the first film of the predetermined region is etched before the processed film is etched.

8. A pattern forming method comprising:
    forming a first resist film on a processed film;
    patterning the first resist film into a first resist pattern;
    forming a first film so as to cover the first resist pattern;
    forming a photo acid generator containing film containing a photo acid generator on the first film;
    forming a second resist film so as to cover the photo acid generator containing film;
    irradiating a predetermined region of the second resist film with exposure light;
    heating the first film and the second resist film;
    performing a development process, removing the second resist film of the predetermined region and forming a second resist pattern while the first film is left; and
    etching the processed film with the first resist pattern and the second resist pattern as a mask.

9. The pattern forming method according to claim 8, comprising:
    applying a film so as to cover the first resist pattern, the film containing a resin, the resin crosslinking in the presence of acid;
    heating the applied film to crosslink the resin in an upper surface and a side surface of the first resist pattern;
    performing a development process to remove uncrosslinking resin; and
    forming the first film only in the upper surface and side surface of the first resist pattern.

10. The pattern forming method according to claim 8, wherein the first film is deposited by a CVD method or a sputtering method so as to cover the first resist pattern and the processed film.

11. The pattern forming method according to claim 10, wherein an organic solvent containing the photo acid generator is applied to a surface of the first film, and
    the organic solvent is dried to form the photo acid generator containing film.

12. The pattern forming method according to claim 8, comprising:
    applying a solution on the first film, the solution containing the photo acid generator and a second resin; and
    heating the solution to form the photo acid generator containing film.

13. The pattern forming method according to claim 8, wherein the photo acid generator is bonded to the second resin.

14. The pattern forming method according to claim 8, wherein, after the second resist pattern is formed, the photo acid generator containing film and the first film of the predetermined region are etched before the processed film is etched.

15. A pattern forming method comprising:
    forming a first resist film on a processed film;
    patterning the first resist film into a first resist pattern;
    forming a first film containing a thermal photo acid generator so as to cover the first resist pattern, the first film being an alcohol-based film;
    forming a second resist film so as to cover the first film;
    irradiating a predetermined region of the second resist film with exposure light;
    heating the first film and the second resist film;

performing a development process, removing the second resist film of the predetermined region while the first film is left, and forming a second resist pattern; and etching the processed film with the first resist pattern and the second resist pattern as a mask.

16. The pattern forming method according to claim 15, comprising:

applying a solution so as to cover the first resist pattern, the solution containing the thermal acid generator and a resin for forming the first film, the thermal acid generator being bonded to the resin; and heating the solution to form the first film.

17. The pattern forming method according to claim 15, wherein the first film is also formed in a surface of the processed film between the first resist patterns.

18. The pattern forming method according to claim 17, wherein the thermal acid generator and the first film are deposited by a CVD method or a sputtering method so as to cover the first resist pattern and the processed film.

19. The pattern forming method according to claim 17, wherein a gap between the first resist patterns is buried to form the first film such that an upper surface of the first film is higher than the upper surface of the first resist pattern, and after the second resist pattern is formed, the first film of the predetermined region is etched before the processed film is etched.

\* \* \* \* \*